(12) United States Patent
Kamimura et al.

(10) Patent No.: US 8,067,984 B2
(45) Date of Patent: Nov. 29, 2011

(54) VARIABLE GAIN CIRCUIT

(75) Inventors: Takehito Kamimura, Tokyo (JP); Norio Chujo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/797,121

(22) Filed: Jun. 9, 2010

(65) Prior Publication Data

US 2010/0315166 A1    Dec. 16, 2010

(30) Foreign Application Priority Data

Jun. 10, 2009  (JP) ................................. 2009-139290

(51) Int. Cl.
  *H03G 3/10*  (2006.01)
(52) U.S. Cl. ....................................... 330/285; 330/278
(58) Field of Classification Search .................. 330/285, 330/296, 278, 295, 124 R
  See application file for complete search history.

(56) References Cited

U.S. PATENT DOCUMENTS 6,175,278 B1 * 1/2001 Hasegawa ..................... 330/278
7,358,816 B2 * 4/2008 Ryu et al. ...................... 330/285
2002/0190796 A1 * 12/2002 Park et al. ..................... 330/285
2006/0022748 A1 * 2/2006 Udagawa ........................ 330/51

OTHER PUBLICATIONS

Ahmed Abd El-Fattah, "Equalizer Implementation for 10 Gbps Serial Data Link in 90 nm CMOS Technology.", IEEE ICM-Dec. 2007, 4 pages.

* cited by examiner

*Primary Examiner* — Henry Choe
(74) *Attorney, Agent, or Firm* — Crowell & Moring LLP

(57) ABSTRACT

There is provided a variable gain circuit system which is inductorless and capable of achieving a high gain and a wide band by elements for achieving variable gain to prevent decreasing a gain or deteriorating the band. The variable gain circuit includes: transistors; a resistor connected as a load of each transistor; a voltage source applying a bias voltage to each gate of the transistors; a switch selectively connecting the voltage source or a ground potential to each gate of the transistors in accordance with gain setting; and a current source connected to a common input. A drain of each transistor is connected to an input of a circuit in a subsequent stage.

16 Claims, 11 Drawing Sheets

HIGH GAIN SETTING

LOW GAIN SETTING

HIGH GAIN SETTING

LOW GAIN SETTING

HIGH GAIN SETTING

LOW GAIN SETTING

HIGH GAIN SETTING

LOW GAIN SETTING

HIGH GAIN SETTING

LOW GAIN SETTING

INTERMEDIATE GAIN SETTING

VARIABLE GAIN CIRCUIT

CROSS-REFERENCE TO RELATED APPLICATION

The present application claims priority from Japanese Patent Application No. 2009-139290 filed on Jun. 10, 2009, the content of which is hereby incorporated by reference into this application.

TECHNICAL FIELD OF THE INVENTION

The present invention relates to a variable gain circuit used in a high-speed transmission technique. More particularly, the present invention relates to a circuit used for an input circuit of a receiving device of a SerDes (Serializer/Deserializer) LSI such as an information processing device like a router, a server, and a RAID and an optical module.

BACKGROUND OF THE INVENTION

Along with increase in a traffic volume of the Internet, it has been required to improve a transmission speed of a SerDes used for an information processing device such as an optical module, router/server, and a RAID. Meanwhile, as seen in Green IT, reduction in a power consumption of the information device has been advanced, and reduction in the power consumption of the SerDes has also been required.

Conventionally, as the SerDes, there has been a technique disclosed in, for example, "Equalizer Implementation for 10 Gbps Serial Data Link in 90 nm CMOS Technology.", IEEE ICM-December 2007, written by Ahmed Abd El-Fattah (Non-Patent Document 1).

Here, an example of a conventional SerDes will be described with reference to FIGS. 9 to 11. FIG. 9 is a configuration diagram illustrating an example of the conventional SerDes, FIG. 10 is a configuration diagram illustrating an example of a conventional receiver, and FIG. 11 is a circuit diagram illustrating a configuration of a conventional variable gain circuit.

In FIG. 9, the SerDes is composed of: a sending unit 704 composed of a driver 701 and a parallel/serial converting circuit 702; and a receiving unit 705 composed of a receiver 208 including a variable gain circuit 201 and a serial/parallel converting circuit 703.

In FIG. 10, the receiver 208 is composed of: the variable gain circuit 201; an equalizer circuit 202; a limit amplifier 203; input terminals 204 and 205; and output terminals 206 and 207. The variable gain circuit 201 matches an input resistance of the receiver with a characteristic impedance of a substrate wiring to suppress reflection noises and equalizes variations in an input signal amplitude due to a difference in a wiring length.

A high-frequency property and power consumption of the receiving device are influenced by the variable gain circuit.

In FIG. 11, the conventional variable gain circuit 201 has a configuration in which, resistors 1001 and 1002 and output terminals 1008 and 1009 are connected to drains, current sources 1007 and 1006 are connected to sources, and a variable resistor 1005 is inserted between sources of transistors 1003 and 1004, and a gain is varied by changing a resistance value of the variable resistor 1005. Moreover, terminating resistors 1012 and 1013 are connected to input terminals 1010 and 1011, respectively, to be matched with the characteristic impedance of the substrate wiring.

SUMMARY OF THE INVENTION

However, in the conventional variable gain circuit 201, there has been a problem that a maximum gain obtained in the variable gain circuit 201 is decreased by the variable resistor 1005 inserted for varying the gain.

Also, since the receiver 208 amplifies the input signal up to a digital signal level, it is required to compensate a decrease amount of the maximum gain of the variable gain circuit 201 by the limit amplifier in a subsequent stage. That is, it is required to increase the number of stages of limit amplifiers, and therefore, its power consumption and area are increased.

Therefore, in order to achieve reductions in the power consumption and area of the receiver, it is required to increase the gain of the variable gain circuit.

In order to increase the gain of the conventional variable gain circuit illustrated in FIG. 11, it is required to increase sizes of the resistors 1001 and 1002 or the transistors 1003 and 1004. However, a band of the variable gain circuit 201 is inversely proportional to a multiplication of a resistance with a parasitic capacitance of a transistor, and therefore, band deterioration is caused by increasing the resistor or transistor size.

Although there is band compensation with using an inductor as means of broadening the band, there has been a problem that, a circuit area is increased since a size of the inductor is large, and therefore, a cost is increased.

Accordingly, a preferred aim of the present invention is to provide a variable gain circuit in which a high gain and a broad band can be achieved in inductorless by elements for achieving the variable gain without decreasing a gain or deteriorating the band.

The above and other preferred aims and novel characteristics of the present invention will be apparent from the description of the present specification and the accompanying drawings.

The typical outline of the inventions disclosed in the present application will be briefly described as follows.

That is, in the typical outline, there are provided: a resistor or an active load composed of a PMOS connected to each of gate-grounded type transistors as a load; a voltage source applying a bias voltage to each gate of the gate-grounded type transistors; a switch selectively connecting either the voltage source or a ground potential to each gate of the gate-grounded type transistors in accordance with gain setting; and a current source connected to a common input. A drain of one or more gate-grounded type transistor among two or more gate-grounded type transistors is connected to an input of a circuit in a subsequent stage.

The effects obtained by typical aspects of the present invention will be briefly described below.

That is, as the effects obtained by typical aspects, a higher gain and a wider band than those of a conventional variable gain circuit can be achieved since there is no gain decrease because of a variable gain.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1A:
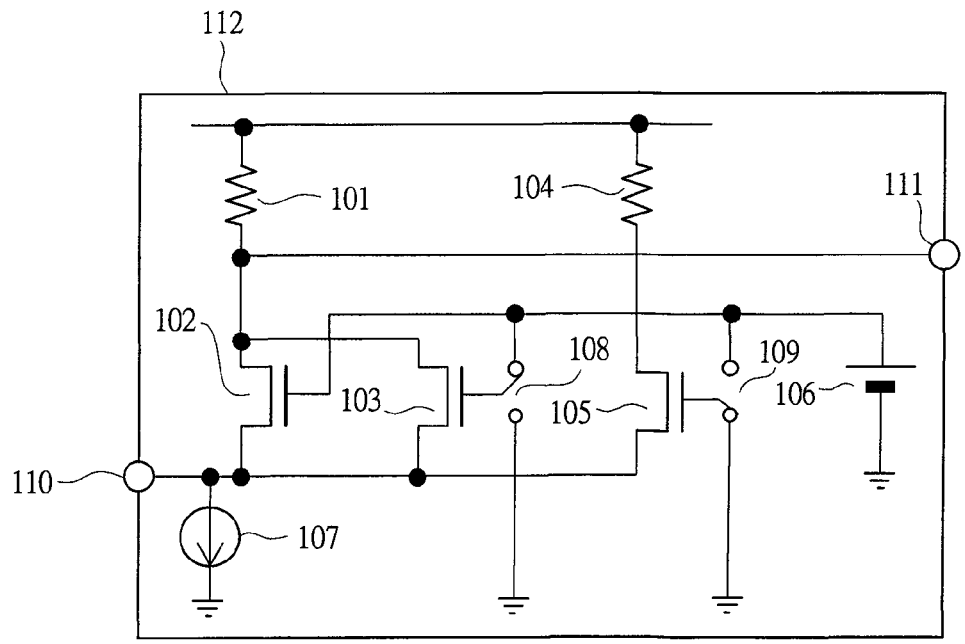
FIG. 1A is a circuit diagram illustrating a configuration of a variable gain circuit according to a first embodiment of the present invention.
Figure 1B:
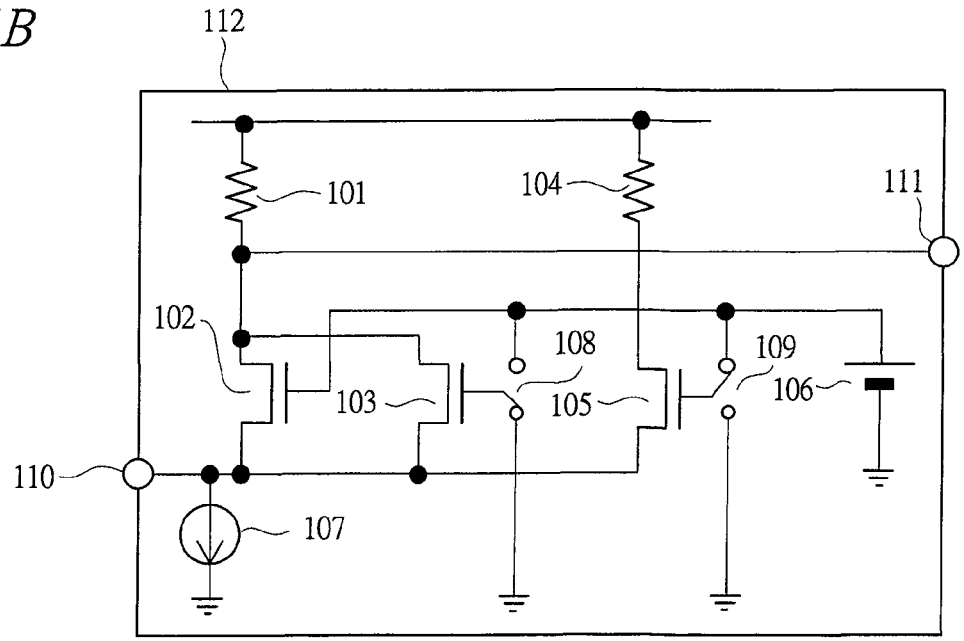
FIG. 1B is a circuit diagram illustrating a configuration of a variable gain circuit according to the first embodiment of the present invention.

With reference to FIGS. 1A and 1B, configurations and operations of a variable gain circuit according to a first embodiment of the present invention will be described. FIGS. 1A and 1B are circuit diagrams illustrating the configurations of the variable gain circuit according to the first embodiment of the present invention.

In FIGS. 1A and 1B, the variable gain circuit 112 is composed of: transistors 102, 103, and 105, whose sources are connected to a common input; a resistor 101 which is commonly connected to drains of the transistors 102 and 103; a resistor 104 which is connected to a drain of the transistor 105; a voltage source 106 which applies a voltage to gates of the transistors 102, 103, and 105; switches 108 and 109 which selectively connect either a ground or the voltage source 106 to respective gate terminals of the transistors 103 and 105; a current source 107 which is connected to an input terminal 110; and an output terminal 111 which is connected to the drain of the transistor 102. The transistors 102, 103, and 105 are composed as gate-grounded type transistors.

Figure 11:
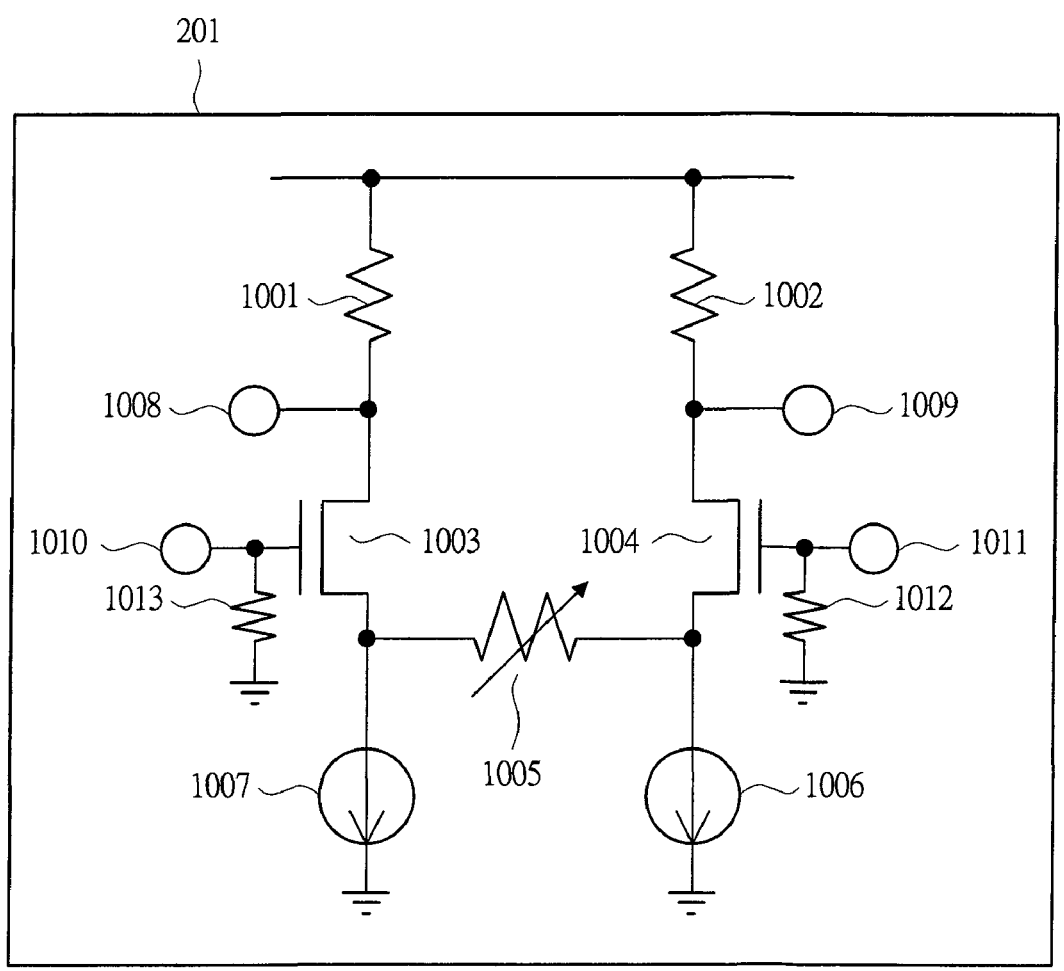
FIG. 11 is a circuit diagram illustrating a configuration of a conventional variable gain circuit.

Also, the variable gain circuit 112 illustrated in FIGS. 1A and 1B illustrates only one side of the conventional variable gain circuit 201 illustrated in FIG. 11, which is a circuit composed of, for example, a resistor 1001, a transistor 1003, a current source 1007, an output terminal 1008, an input terminal 1010, and a terminating resistor 1013. When the same circuit as the conventional variable gain circuit 201 illustrated in FIG. 11 is required, the circuit is composed of two variable gain circuits 112.

In the variable gain circuit 112, the gain is varied by changing a shunted amount of an input current shunted into the resistor 101 connected to an input of a circuit in a subsequent stage and the resistor 104 not connected to any other circuit.

FIG. 1A illustrates a switch state in a high gain setting.

In the high gain setting, the switch 108 is connected to the voltage source 106, and the switch 109 is connected to the ground potential. At this time, all the input currents are converted to a voltage at the resistor 101, and therefore, the highest gain state can be obtained.

When transconductance of the transistors 102 and 103 are taken as "gm2" and "gm3", respectively, the gain is determined by a ratio of a resistance value of the resistor 101 to an input resistance $[1/(gm2+gm3)]$.

FIG. 1B illustrates a switch state in a low gain setting.

In the low gain setting, the switch 108 is connected to the ground potential, and the switch 109 is connected to the voltage source 106. At this time, the input current is shunted into the resistor 101 and the resistor 104, and therefore, the gain is determined by a ratio of a source resistance $[1/gm2]$ of the transistor 102 to the resistor 101, so that the transistor 105 is irrelevant to the gain.

When the transconductance of the transistor 105 is taken as "gm5", the input resistance has a value of $[1/(gm2+gm5)]$. When transistor sizes of the transistors 103 and 105 are equal to each other, gm3 becomes equal to gm5, so that the input resistance can be equal to that in the high gain setting.

In the conventional variable gain circuit 201 illustrated in FIG. 11, source resistances of the transistors 1003 and 1004 are increased due to the variable resistor 1005 added for the variable gain, and therefore, the gain is decreased.

When a variable range of the variable resistor 1005 is expanded or the source resistances are decreased by increasing the sizes of the transistor 1003 and 1004 in order to increase the gain, parasitic capacitances of the transistors are increased, and the band is narrowed. In the present embodiment, the gain is not decreased by the variable gain, and therefore, a higher gain and a wider band than those of the conventional variable gain circuit can be achieved.

Note that, in the examples illustrated in FIGS. 1A and 1B, transistors connected to the resistor 101 are two transistors 102 and 103, and a transistor connected to the resistor 104 is one transistor 105. However, by controlling the number of the transistors connected to the resistor 101 as "n" pieces, the number of the transistors connected to the resistor 104 as "n-1" pieces, and the total number of the transistors connected to the voltage source 106 as "n" pieces, a variable resolution and the variable range of the gain can be increased without changing the input resistance.

Also, the current source 107 illustrated in FIGS. 1A and 1B may be replaced with a variable current source. By changing a current amount of the current source 107, the transconductance of the transistors can be changed, and the input resistance can be adjusted.

In this manner, even when process variation or changes in a temperature or a power-supply voltage is caused, the input resistance can be always matched with an impedance of a wiring, so that deterioration of waveform qualities due to reflected waves can be prevented.

Further, the resistors 101 and 104 may be replaced with active loads each composed of a PMOS. By changing gate potentials of the active loads, values of the loads can be constantly maintained even when process variation or changes in a temperature or a power-supply voltage is caused.

Second Embodiment

Figure 2:
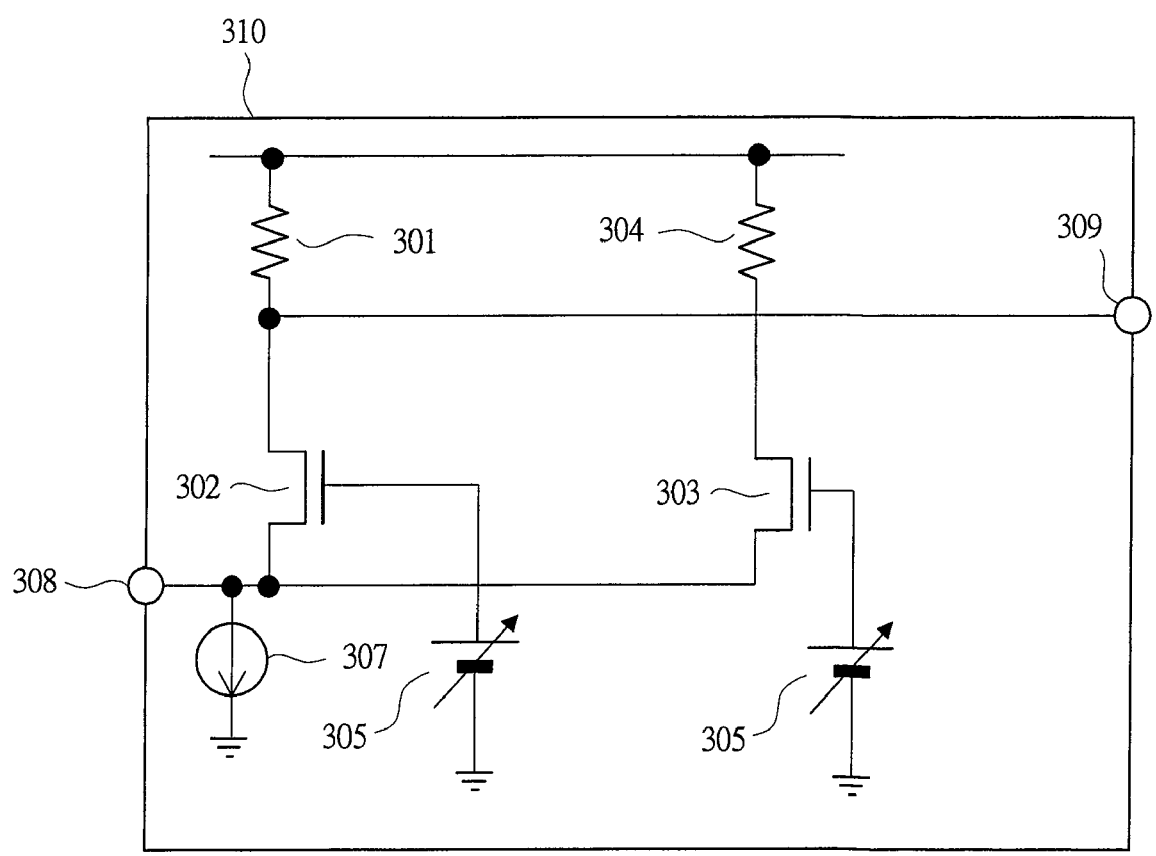
FIG. 2 is a circuit diagram illustrating a configuration of a variable gain circuit according to a second embodiment of the present invention.

With reference to FIG. 2, a configuration and operations of a variable gain circuit according to a second embodiment of the present invention will be described. FIG. 2 is a circuit diagram illustrating the configuration of the variable gain circuit according to the second embodiment of the present invention.

In FIG. 2, a variable gain circuit 310 is composed of: transistors 302 and 303 whose sources are connected to a common input; a resistor 301 which is connected to a drain of the transistor 302; a resistor 304 which is connected to a drain of the transistor 303; a variable voltage source 305 which applies a voltage to a gate of the transistor 302; a variable voltage source 306 which applies a voltage to a gate of the transistor 303; a current source 307 which is connected to an input terminal 308; and an output terminal 309 which is connected to the drain of the transistor 302.

In the present embodiment, the gain can be varied by adjusting the voltages applied to the gate terminals of the transistors 302 and 303 by the variable voltage sources 305 and 306. In a high gain, by increasing the voltage of the variable voltage source 305 and decreasing the voltage of the variable voltage source 306, a sum of transconductances of the transistors 302 and 303 becomes constant.

In a low gain, by decreasing the voltage of the variable voltage source 305 and increasing the voltage of the variable voltage source 306 so that the sum of the transconductances of the transistors 302 and 303 becomes constant, the gain can be varied with constantly maintaining the input resistance.

In the first embodiment, it is required to increase the number of dividing the circuit in order to increase the variable resolution of the gain, and therefore, a circuit scale is increased. However, in the gain adjustment of the present embodiment, it is only required to increase the voltage resolutions of the variable voltage sources 305 and 306, and therefore, the variable resolution of the gain can be easily increased.

Note that, by replacing the current source 307 with a variable current source similarly to the first embodiment, even when process variation or changes in a temperature or a power-supply voltage is caused, the input resistance can be always matched with an impedance of a wiring, so that deterioration of waveform qualities due to reflected waves can be prevented.

Further, the resistors 301 and 304 may be replaced with active loads each composed of a PMOS. Similarly to the first embodiment, by changing gate potentials of the active loads, values of the loads can be constantly maintained even when process variation or changes in a temperature or a power-supply voltage is caused.

Third Embodiment

Figure 3A:
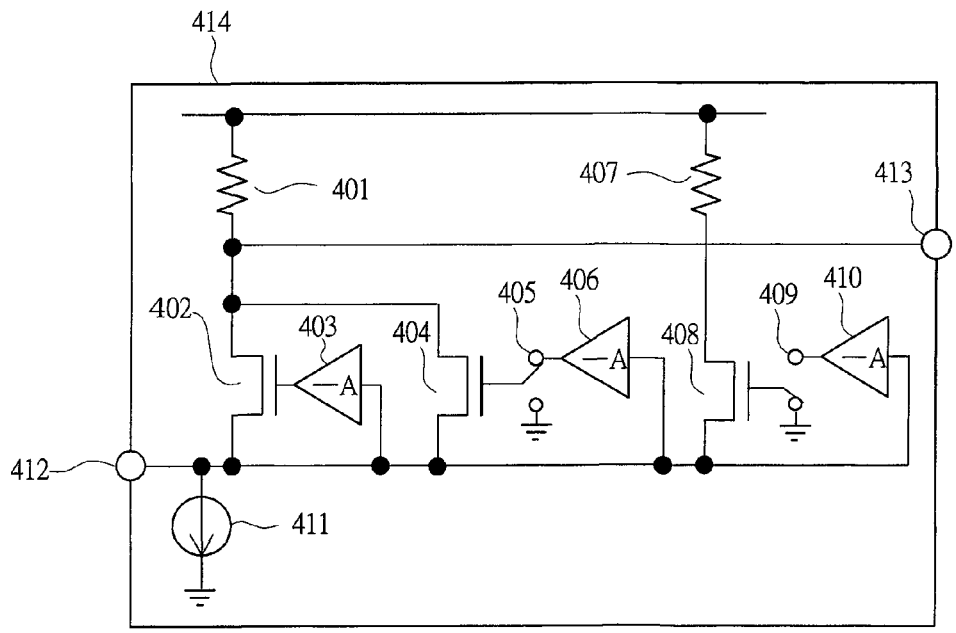
FIG. 3A is a circuit diagram illustrating a configuration of a variable gain circuit according to a third embodiment of the present invention.
Figure 3B:
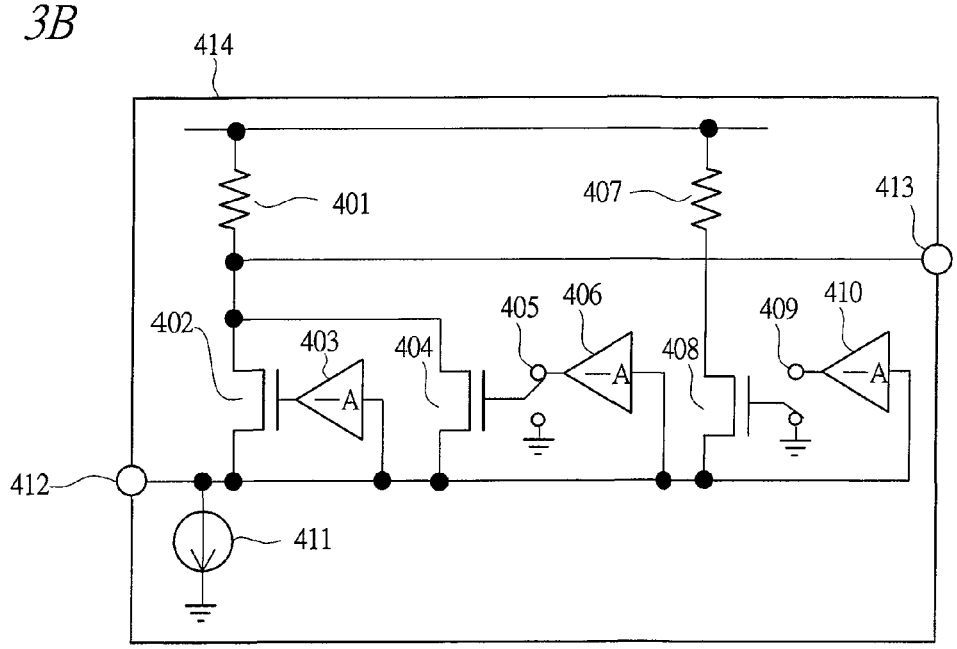
FIG. 3B is a circuit diagram illustrating a configuration of a variable gain circuit according to the third embodiment of the present invention.

With reference to FIGS. 3A and 3B, configurations and operations of a variable gain circuit according to a third embodiment of the present invention will be described. FIGS. 3A and 3B are circuit diagrams each illustrating a configuration of the variable gain circuit according to the third embodiment of the present invention.

In FIGS. 3A and 3B, a variable gain circuit 414 is composed of: transistors 402, 404, and 408 whose sources are connected to a common input; a resistor 401 which is commonly connected to drains of the transistors 402 and 404; a resistor 407 which is connected to a drain of the transistor 408; an amplifier 403 whose input is from an input terminal 412 and which applies a signal to a gate of the transistor 402, the signal being −A times the input signal; an amplifier 410 whose input is from the input terminal 412 and which applies a signal to a gate of the transistor 404, the signal being −A times the input signal; a switch 405 which selectively connects either a ground or an output of the amplifier 406 to a gate terminal of the transistor 404; a switch 409 which selectively connects either the ground or an output of the amplifier 410 to a gate terminal of the transistor 408; a current source 411 which is connected to the input terminal 412; and an output terminal 413 which is connected to the drain of the transistor 402.

FIG. 3A illustrates a switch state in a high gain setting.

In the high gain setting, the switch 405 is connected to the amplifier 406, and the switch 409 is connected to the ground potential. All the input currents are converted to a voltage at the resistor 401, and therefore, the highest gain state can be obtained.

When transconductances of the transistors 402, 404, and 408 are taken as "gm42", "gm45", and "gm48", respectively, and the gains of the amplifiers 403, 406, and 410 are "−A", the input resistance has a value of $[1/\{(1+A)(gm42+gm45)\}]$.

FIG. 3B illustrates a switch state in a low gain setting.

In the low gain setting, the switch 405 is connected to the ground potential, and the switch 409 is connected to the amplifier 410. The input current is shunted into the resistors 401 and 407, and therefore, the gain is decreased.

The input resistance has a value of $[1/\{(1+A)(gm42+gm48)\}]$. Here, when transistor sizes of the transistors 404 and 408 are equal to each other, gm45 becomes equal to gm48, so that the same input resistance can be maintained in the high gain setting and the low gain setting.

In the present embodiment, since feedback is performed by the amplifiers 403, 406, and 410, a value of the transconductance of the transistor can become (1+A) times the original value. Therefore, in order to obtain the same input resistance as that of the variable gain circuit 112 illustrated in FIGS. 1A and 1B, the sizes of the transistors 402, 404, and 408 can be reduced by $[1/(1+A)]$ as compared with those of the transistors 102, 103, and 105 illustrated in FIGS. 1A and 1B. Therefore, since the parasitic capacitances of the transistors 402, 404, and 408 can be reduced by $[1/(1+A)]$, the wider band than that in the variable gain circuit 112 illustrated in FIGS. 1A and 1B can be achieved.

Note that, in the variable gain circuit 414 illustrated in FIGS. 3A and 3B, the current source 411 may be replaced with a variable current source. Also, the amplifiers 403, 406, and 410 may be replaced with variable gain amplifiers. By carrying out either one of or both of the replacements, even when gm of each transistor 402, 404, and 408 or the gain of each amplifier 403, 406, and 410 is changed due to manufacturing variation or change in a temperature or a power-supply voltage, the current amount of the current source 411 or the gains of the amplifiers 403, 406, and 410 is adjusted, so that the input resistance can be always matched with the characteristic impedance of the wiring, and deterioration of waveform qualities due to reflected waves can be prevented.

Further, the resistors 401 and 407 may be replaced with active loads each composed of a PMOS. Similarly to the first embodiment, by changing gate potentials of the active loads, values of the loads can be constantly maintained even when process variation or changes in a temperature or a power-supply voltage is caused.

Fourth Embodiment

Figure 4A:
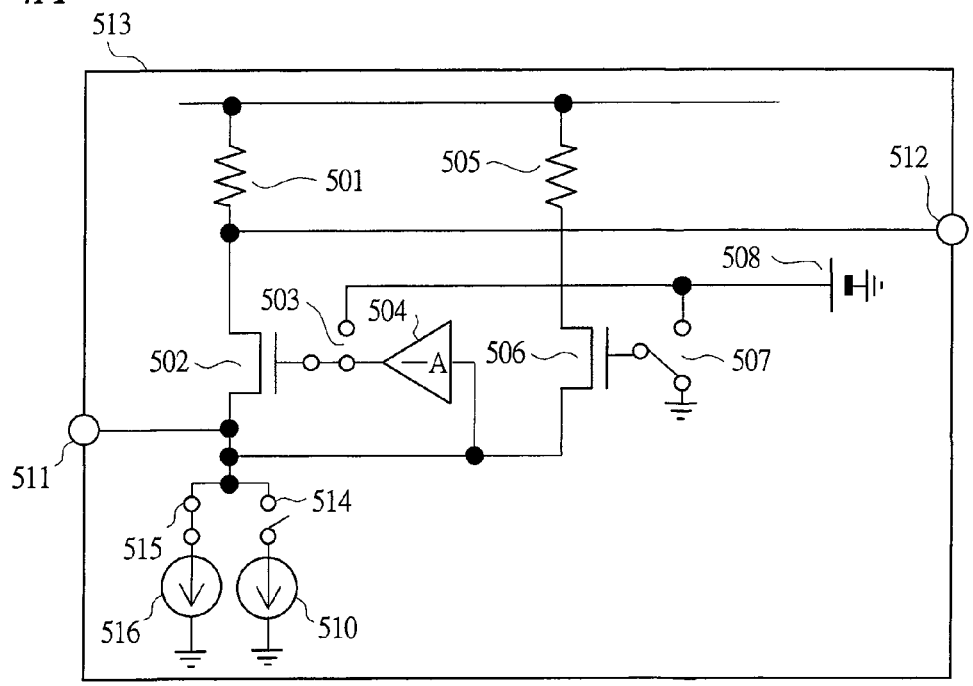
FIG. 4A is a circuit diagram illustrating a configuration of a variable gain circuit according to a fourth embodiment of the present invention.
Figure 4B:
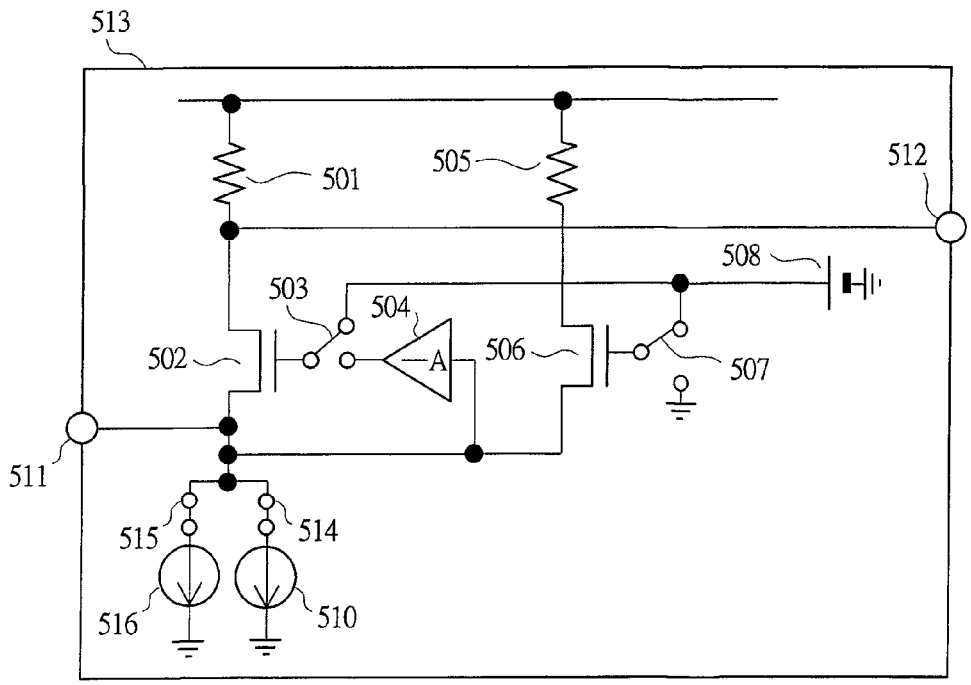
FIG. 4B is a circuit diagram illustrating a configuration of a variable gain circuit according to the fourth embodiment of the present invention.

With reference to FIGS. 4A and 4B, configurations and operations of a variable gain circuit according to a fourth embodiment of the present invention will be described. FIGS. 4A and 4B are circuit diagrams each illustrating the configuration of the variable gain circuit according to the fourth embodiment of the present invention.

In FIGS. 4A and 4B, a variable gain circuit 513 is composed of: transistors 502 and 506 whose sources are connected to a common input; a resistor 501 which is connected to a drain of the transistor 502; a resistor 505 which is connected to a drain of the transistor 506; an amplifier 504 which is connected to an input terminal 511 and a gate of the transistor 502; a voltage source 508 which applies a voltage to gates of the transistors 502 and 506; a switch 503 which selectively connects either an output of the amplifier 504 or the voltage source 508 to a gate terminal of the transistor 502; a switch 507 which selectively connects either a ground or the voltage source 508 to a gate terminal of the transistor 506; switches 514 and 515 which are connected to the input terminal 511; a current source 510 which is connected to the switch 514; a current source 516 which is connected to the switch 515; and an output terminal 512 which is connected to the drain of the transistor 502.

FIG. 4A illustrates a switch state in a high gain setting.

In the high gain setting, the switch 503 is connected to the amplifier 504, the switch 507 is connected to the ground potential, the switch 515 is connected to the input terminal 511, and the switch 514 is opened. All the input currents are converted to a voltage at the resistor 501, and therefore, the highest gain state can be obtained.

Further, similarly to the third embodiment, a value of the parasitic capacitance of the transistor becomes [1/(1+A)] times that of the variable gain circuit 112 illustrated in FIGS. 1A and 1B by the amplifier 504 to achieve the wider band.

FIG. 4B illustrates a switch state in a low gain setting.

In the low gain setting, the switches 503 and 507 are connected to the voltage source 508, and the switches 515 and 514 are connected to the input terminal 511. The input current is shunted into the resistors 501 and 505, and therefore, the gain is decreased.

Still further, since the connection of the gate terminal of the transistor 502 is changed from the amplifier 504 to the voltage source 508, the input resistance becomes larger than that in the high gain setting. In order to adjust this large input resistance to have the same input resistance value as that in the high gain setting, the switch 514 is also connected to the input terminal 511 so as to add a current of the current source 510, so that the transconductance of the transistor is increased and the input resistance is constantly controlled.

An input dynamic range of the variable gain circuit 513 is determined by multiplication of the input resistance with current amounts of the current sources 510 and 516 connected to the input terminal. Since the input resistance is matched with the characteristic impedance of the wiring, an input dynamic range in the low gain setting can be widened by the current amount of the current source 510 compared to that in the high gain setting.

In the third embodiment, the current amount of the current source 411 is not changed both in the high gain setting and the low gain setting. Therefore, in the present embodiment, the wider input dynamic range can be achieved in the low gain setting.

Note that the resistors 501 and 505 may be replaced with active loads each composed of a PMOS. Similarly to the first embodiment, by changing gate potentials of the active loads, values of the loads can be constantly maintained even when process variation or changes in a temperature or a power-supply voltage is caused.

Figure 5A:
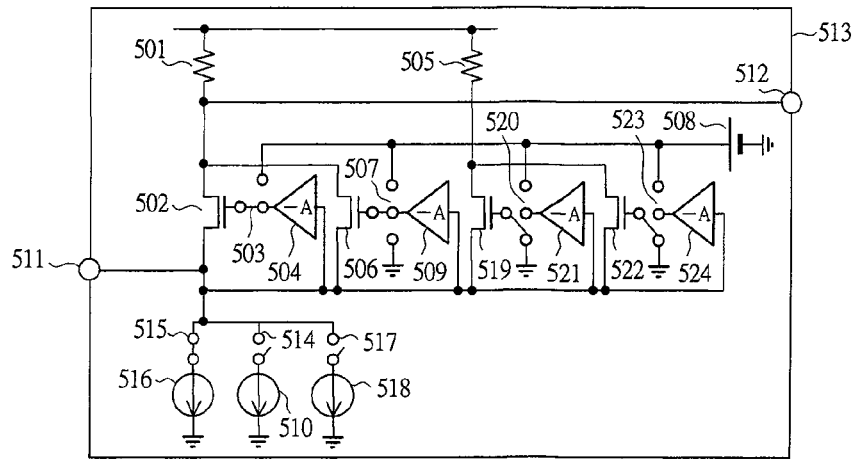
FIG. 5A is a circuit diagram illustrating another configuration of a variable gain circuit according to the fourth embodiment of the present invention.
Figure 5B:
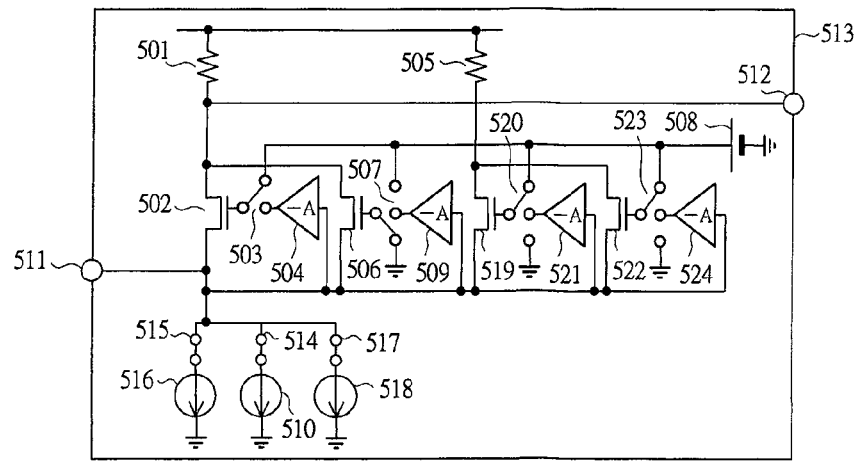
FIG. 5B is a circuit diagram illustrating another configuration of a variable gain circuit according to the fourth embodiment of the present invention.
Figure 5C:
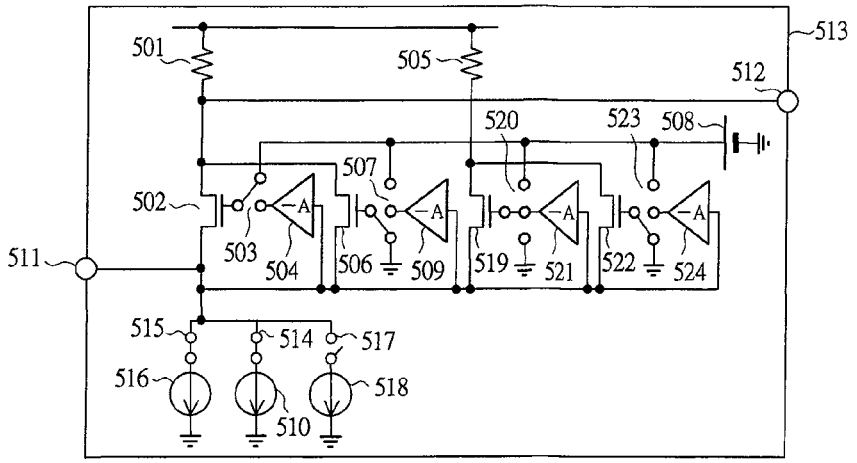
FIG. 5C is a circuit diagram illustrating another configuration of a variable gain circuit according to the fourth embodiment of the present invention.

Next, with reference to FIGS. 5A, 5B, and 5C, another configurations and operations of the variable gain circuit according to the fourth embodiment of the present invention will be described. FIGS. 5A, 5B, and 5C are circuit diagrams each illustrating the another configuration of the variable gain circuit according to the fourth embodiment of the present invention, and illustrates circuit configurations in which the number of switching the variable gain is more than those of the examples illustrated in FIGS. 4A and 4B.

In FIGS. 5A, 5B, and 5C, the variable gain circuit 513 is composed of: transistors 502, 506, 519, and 522, whose sources are connected to a common input; a resistor 501 which is connected to drains of the transistors 502 and 506; a resistor 505 which is connected to drains of the transistors 519 and 522; amplifiers 504, 509, 521, and 524 which are connected to the input terminal 511 and gates of the respective transistors 502, 506, 519, and 522; a voltage source 508 which applies a voltage to the gates of the transistors 502, 506, 519, and 522; a switch 503 which selectively connects either an output of the amplifier 504 or the voltage source 508 to a gate terminal of the transistor 502; a switch 507 which selectively connects any of a ground, an output of the amplifier 509, or the voltage source 508 to a gate terminal of the transistor 506; a switch 520 which selectively connects any of the ground, an output of the amplifier 521, or the voltage source 508 to a gate terminal of the transistor 519; a switch 523 which selectively connects any of the ground, an output of the amplifier 524, or the voltage source 508 to a gate terminal of the transistor 522; switches 514, 515, and 517 which are connected to the input terminal 511; a current source 510 which is connected to the switch 514; a current source 516 which is connected to the switch 515; a current source 518 which is connected to the switch 517; and an output terminal 512 which is connected to the drain of the transistor 502.

FIG. 5A illustrates a switch state in a high gain setting.

In the high gain setting, the switches 503 and 507 are connected to the amplifiers 504 and 509, the switches 520 and 523 are connected to the ground potential, the switch 515 is connected to the input terminal 511, and the switches 514 and 517 are opened.

All the input currents are converted to a voltage at the resistor 501, and therefore, the highest gain state can be obtained.

Further, similarly to the third embodiment, the parasitic capacitance of the transistor becomes [1/(1+A)] times that of the variable gain circuit 112 illustrated in FIGS. 1A and 1B by the amplifiers 504, 509, 521, and 524 to achieve the wider band.

FIG. 5B illustrates a switch state in a low gain setting.

In the low gain setting, the switches 503, 520, and 523 are connected to the voltage source 508, and the switches 514, 515, and 517 are connected to the input terminal 511. The input current is shunted into the resistors 501 and 505, and therefore, the gain is decreased.

Still further, since the connections of the gate terminals of the transistors 502, 519, and 522 are changed from the amplifiers to the voltage source 508, the input resistance becomes larger than that in the high gain setting. In order to adjust this large input resistance to have the same input resistance value as that in the high gain setting, the switches 514 and 517 are also connected to the input terminal 511 so as to add currents of the current sources 510 and 518, and a parallel-connected number of transistors is increased, so that the transconductance of the transistor is increased and the input resistance is constantly controlled.

An input dynamic range of the variable gain circuit 513 is determined by multiplication of the input resistance with a total current amount of the current sources 510, 516, and 518 connected to the input terminal. Since the input resistance is matched with the characteristic impedance of the wiring, an input dynamic range in the low gain setting can be widened by the current amounts of the current sources 510 and 518 compared to that in the high gain setting.

In the third embodiment, the current amount of the current source 411 is not changed both in the high gain setting and the low gain setting. Therefore, the circuit according to the present embodiment has the wider input dynamic range in the low gain setting.

FIG. 5C illustrates a switch state in an intermediate gain setting.

In the intermediate gain setting, the switch 503 is connected to the voltage source 508, the switches 507 and 523 are connected to the ground, and the switch 520 is connected to the output of the amplifier 521. And, the switches 514 and 515 are connected to the input terminal 511, and the switch 517 is opened.

When the gain of the amplifier is smaller than once, the transconductance of the transistor 519 becomes smaller than that of two transistors 502, and therefore, the gain of the transistor 519 becomes higher than that in the low gain setting.

Also, since the gate of the transistor 519 is grounded, the input resistance is larger than that in the high gain setting. In order to adjust this large input resistance to have the same input resistance value as that in the high gain setting, the switch 514 is also connected to the input terminal 511 so as to add the current of the current source 510, so that the transconductance of the transistors are increased and the input resistance is constantly controlled.

An input dynamic range of this variable gain circuit is determined by multiplication of the input resistance with a total current amount of the current sources 510 and 516 connected to the input terminal. Since the input resistance is caused to be matched with the characteristic impedance of the wiring, the input dynamic range can be widened by the current amount of the current source 510 compared to that in the high gain setting.

In the third embodiment, the current amount of the current source 411 is not changed both in the high gain setting and the low gain setting. Therefore, the circuit according to the present embodiment has a wider input dynamic range in the intermediate gain setting.

Fifth Embodiment

A fifth embodiment is an example of an inter-LSI transmission system to which the variable gain circuit 112 according to the first embodiment is employed.

Figure 6:
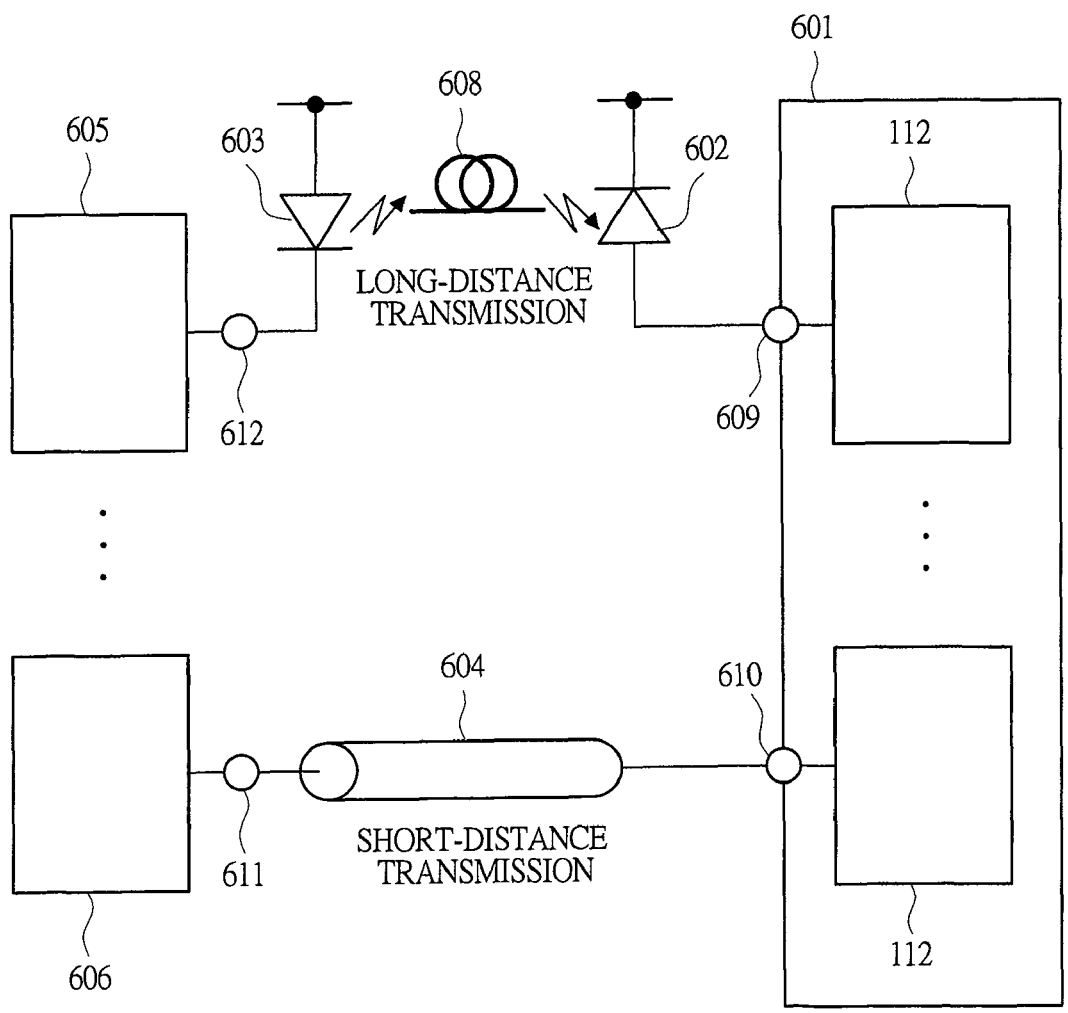
FIG. 6 is a configuration diagram of an inter-LSI transmission system to which a variable gain circuit according to a fifth embodiment of the present invention is employed.

With reference to FIG. 6, the inter-LSI transmission system to which the variable gain circuit according to the fifth embodiment of the present invention is employed will be described. FIG. 6 is a configuration diagram of the inter-LSI transmission system to which the variable gain circuit according to the fifth embodiment of the present invention is employed.

In FIG. 6, the inter-LSI transmission system is composed of: an LSI 601 which has a plurality of variable gain circuits 112; a photodiode (PD) 602 which converts optical signals to current signals; a laser diode (LD) 603 which converts electric signals to optical signals; an LSI 605, which is provided on the assumption that a distance to the LSI 601 is long; an optical fiber 608; an LSI 606 which is provided on the assumption that a distance to the LSI 601 is short; and a transmission path 604 for the electric signals between the LSIs 601 and 606.

Since both of the voltage input and the current input can be handled by the variable gain circuit 112 as illustrated in FIGS. 1A and 1B of the first embodiment, the both can be handled without changing the receiving circuit by using optical signals in the long-distance transmission between the LSIs 601 and 605 and using electric signals in the short-distance transmission between the LSIs 601 and 606.

Therefore, regardless of the optical transmission or the electric transmission, they can be freely switched with one LSI, and a degree of freedom as a system is increased.

Also, the variable gain circuit 112 is inductorless, and therefore, a circuit area of a receiving device can be reduced. Therefore, cost reduction can be achieved. Further, since the circuit area of the receiving device can be reduced, the multichannel can be achieved.

Note that the variable gain circuit 112 may be replaced with the variable gain circuit 310, 414, or 513 according to the second to fourth embodiments.

Sixth Embodiment

A sixth embodiment is an example of a SerDes to which the variable gain circuit 112 according to the first embodiment is employed.

Figure 9:
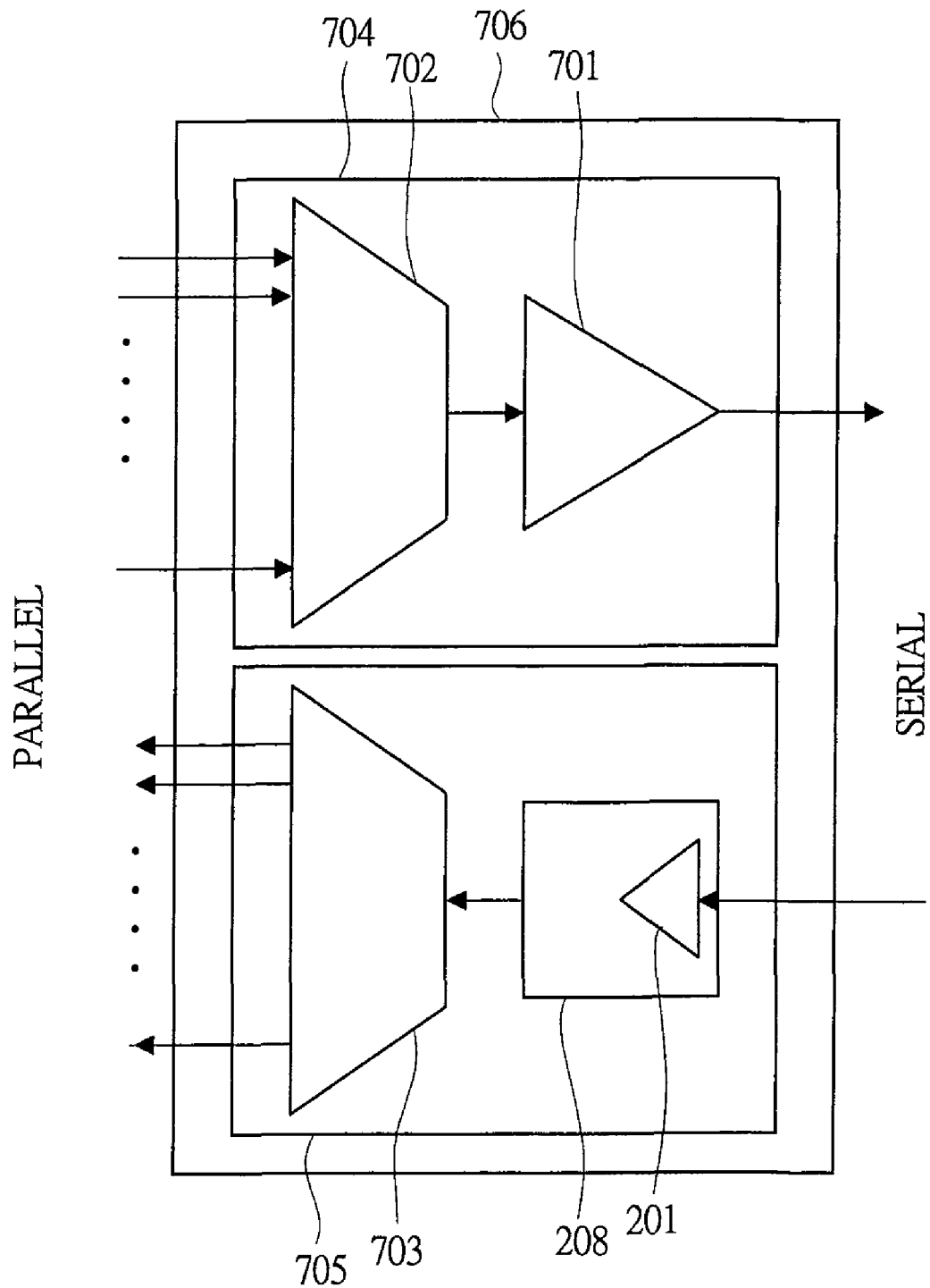
FIG. 9 is a configuration diagram illustrating an example of a conventional SerDes.
Figure 10:
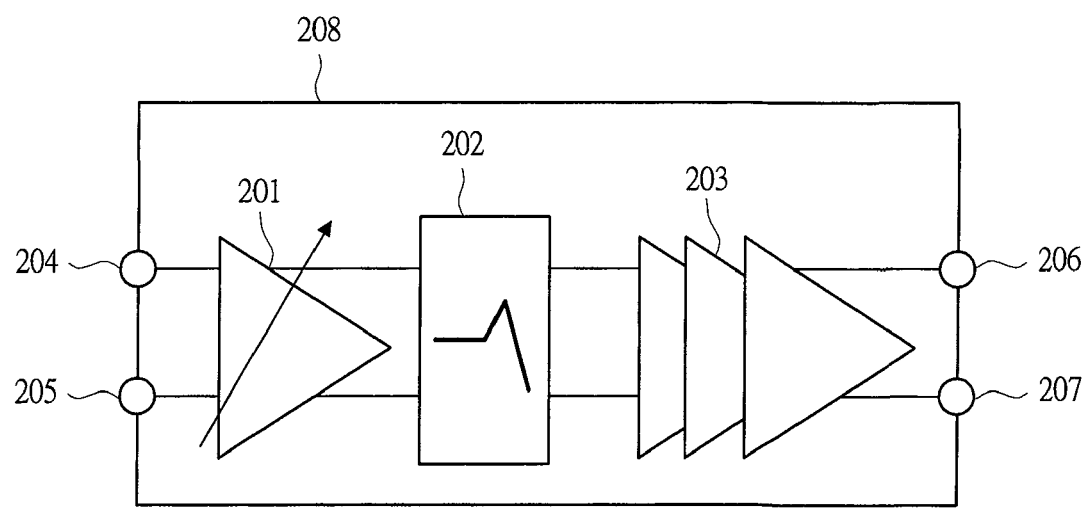
FIG. 10 is a configuration diagram illustrating an example of a conventional receiver.

In the present embodiment, the variable gain circuit 112 as illustrated in FIGS. 1A and 1B is employed instead of the variable gain circuit 201 in a conventional SerDes as illustrated in FIG. 9.

The variable gain circuit 112 illustrated in FIGS. 1A and 1B can be used as an input circuit having an input impedance of 50Ω in a receiving unit in a SerDes 706, so that a transmission speed of the receiving unit can be improved.

Also, since the variable gain circuit 112 has the high gain, the number of stages of limit amplifiers can be reduced by a degree of the increased gain, and therefore, the power consumption of the SerDes 706 can be reduced. Further, since the variable gain circuit 112 has the wide band and is inductorless, the circuit area of the SerDes 706 can be reduced, and therefore, the cost reduction and multichannel can be achieved.

Note that the variable gain circuit 112 may be replaced with the variable gain circuit 310, 414, or 513 according to the second to fourth embodiments.

Seventh Embodiment

A seventh embodiment is an example of an optical module to which the variable gain circuit 112 according to the first embodiment is employed.

Figure 7:
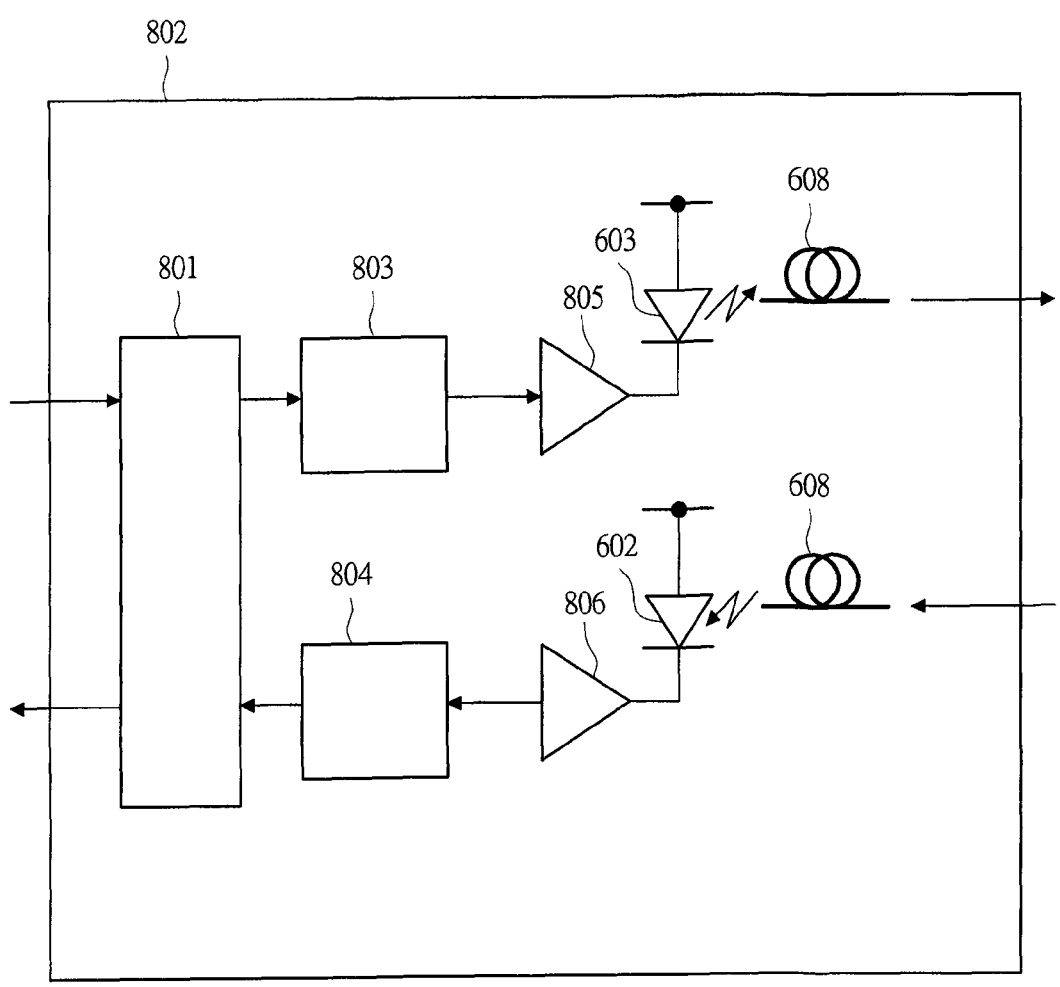
FIG. 7 is a configuration diagram illustrating a configuration of an optical module to which a variable gain circuit according to a seventh embodiment of the present invention is employed.

With reference to FIG. 7, the optical module to which the variable gain circuit 112 according to the seventh embodiment of the present invention is employed will be described. FIG. 7 is a configuration diagram illustrating a configuration of the optical module to which the variable gain circuit 112 according to the seventh embodiment of the present invention is employed.

In FIG. 7, the optical module 802 is composed of: a photodiode (PD) 602; a laser diode (LD) 603; a receiving unit 804 on which the variable gain circuit 112 illustrated in FIGS. 1A and 1B is mounted; a sending unit 803; an electrical connector 801; an LD driver 805; a TIA 806; and an optical fiber 608.

A transmission speed of the receiving unit can be improved by the variable gain circuit 112, and therefore, a receive transmission speed of the optical module can be improved. Also, since the variable gain circuit 112 has the high gain, the number of stages of limit amplifiers can be reduced by a degree of the high gain, and therefore, the power consumption of the optical module can be reduced.

Note that the receiving unit 804 may be provided such that the variable gain circuit 112 is made into an IC. Also, the variable gain circuit 112 may be replaced with any of the variable gain circuit 310, 414, or 513 according to the second to fourth embodiments.

Eighth Embodiment

An eighth embodiment is an example of a router on which a SerDes having the variable gain circuit 112 according to the first embodiment is mounted as an input circuit.

Figure 8:
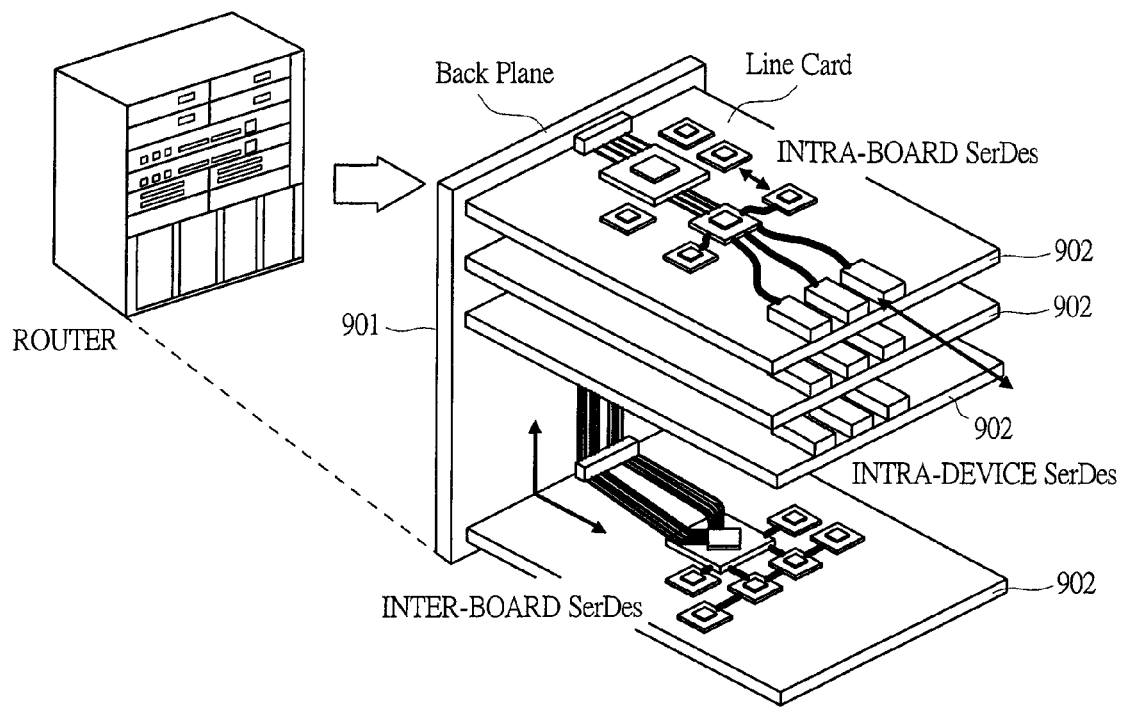
FIG. 8 is a configuration diagram illustrating a configuration of a router on which a SerDes having a variable gain circuit according to an eighth embodiment of the present invention is mounted as an input circuit.

With reference to FIG. 8, a router according to the eighth embodiment of the present invention, on which the SerDes having the variable gain circuit as the input circuit is mounted, will be described. FIG. 8 is a configuration diagram illustrating a configuration of the router according to the eighth embodiment of the present invention, on which the SerDes having the variable gain circuit as the input circuit is mounted.

In FIG. 8, the router is composed of a back plane board 901 and line cards 902 on which many LSIs are mounted.

In the router, the SerDes is mounted on interface units which carry out inter-device transmission, inter-board transmission, and intra-board transmission. In a receiving device in the SerDes to which the variable gain circuit 112 as illustrated in FIGS. 1A and 1B is employed, the variable gain circuit can be used as an input circuit having an input impedance of 50Ω, so that, a transmission speed of the receiving device can be improved and the power consumption of the SerDes can be reduced by reducing the number of stages of limit amplifiers in the variable gain circuit 112 by a degree of the high gain, and therefore, high speed and power consumption reduction of the router are possible.

Further, since the variable gain circuit 112 is inductorless, a circuit area of the SerDes can be reduced, and therefore, cost reduction and multichannel of the router can be achieved.

Note that a basic structure is the same also in a server or a RAID, and therefore, high speed, power consumption reduction, area reduction, cost reduction, and multichannel can be achieved similarly to the router.

Also, the variable gain circuit 112 may be replaced with the variable gain circuit 310, 414, or 513 according to the second to fourth embodiments.

In the foregoing, the invention made by the inventors has been concretely described based on the embodiments. However, it is needless to say that the present invention is not limited to the foregoing embodiments and various modifications and alterations can be made within the scope of the present invention.

The present invention relates to a variable gain circuit used in a high-speed transmission technique and can be widely employed to an input circuit of a receiving device of a SerDes (Serializer/Deserializer) LSI such as an information processing device like a router, a server, and a RAID and an optical module.

What is claimed is:

1. A variable gain circuit comprising:
   two or more gate-grounded type transistors whose sources are connected to a common input;
   a resistor or an active load composed of a PMOS connected to each of the gate-grounded type transistors as a load;
   a gate voltage source selectively applying a bias voltage to each gate of the gate-grounded type transistors in accordance with a gain setting; and
   a current source connected to the common input, wherein
   a drain of one or more gate-grounded type transistor among the two or more gate-grounded type transistors is connected to an output terminal that is connectable to an input of a circuit in a subsequent stage.

2. The variable gain circuit according to claim 1, wherein the gate voltage source is a variable voltage source connected to each gate of the gate-grounded type transistors and variably applying a bias voltage thereto in accordance with gain setting.

3. The variable gain circuit according to claim 2, wherein, when a voltage of a variable voltage source connected to a gate of one or more gate-grounded type transistor among the two or more gate-grounded type transistors is increased, a voltage of a variable voltage source connected to a gate of the other gate-grounded type transistor is decreased.

4. The variable gain circuit according to claim 1, wherein the gate voltage source includes:
   an amplifier applying a signal obtained by amplifying an input signal to each gate of the gate-grounded type transistors; and
   a switch selectively connecting either the amplifier or a ground potential to each gate of the gate-grounded type transistors in accordance with gain setting.

5. The variable gain circuit according to claim 4, wherein the switch is controlled so that a total number of the gate-grounded type transistors each connected to the amplifier is always the same number.

6. The variable gain circuit according to claim 1, wherein an input resistance is varied by varying a current amount of the current source.

7. The variable gain circuit according to claim 4, wherein an input resistance is varied by varying a current amount of the current source, varying a gain of the amplifier, or varying both of the current amount of the current source and the gain of the amplifier.

8. The variable gain circuit according to claim 1, wherein the gate voltage source includes:
   an amplifier applying a signal obtained by amplifying an input signal to each gate of the gate-grounded type transistors;
   a voltage source applying a bias voltage to each gate of the gate-grounded type transistors; and
   a switch selectively connecting any of the voltage source, the amplifier, or a ground potential to each gate of the gate-grounded type transistors in accordance with gain setting.

9. The variable gain circuit according to claim 8, wherein an input resistance is constantly controlled by controlling a total number of the gate-grounded type transistors not connected to the ground potential, a gain of the amplifier connected to each gate of the gate-grounded type transistors, and a current amount of the variable current source.

10. The variable gain circuit according to claim 1, wherein the gate voltage source includes:
- a voltage source applying a bias voltage to each gate of the gate-grounded type transistors; and
- a switch selectively connecting either the voltage source or a ground potential to each gate of the gate-grounded type transistors in accordance with gain setting.

11. The variable gain circuit according to claim 10, wherein
the switch is controlled so that a total number of the gate-grounded type transistors each connected to the voltage source is always the same number.

12. A variable gain circuit comprising:
- at least two gate-grounded type transistors whose sources are connected to a common input;
- a current source connected to the common input;
- a resistor or an active load composed of a PMOS connected to each of the gate-grounded type transistors as a load; and
- a voltage supply circuit applying a bias voltage to each gate of the gate-grounded type transistors;
- wherein, said voltage supply circuit comprises one of i) a switch selectively connecting either of a voltage source and a ground potential to each gate of the gate-grounded type transistors in accordance with gain setting; ii) a variable voltage source connected to each gate of the gate-grounded type transistors and variably applying a bias voltage thereto in accordance with gain setting; iii) an amplifier which outputs a signal obtained by amplifying an input signal, and a switch selectively connecting one of an output of the amplifier or a ground potential to each gate of the gate-grounded type transistors in accordance with gain setting; and iv) an amplifier which outputs a signal obtained by amplifying an input signal, a voltage source, and a switch selectively connecting one of an output of the voltage source, an output of the amplifier, and a ground potential, to each gate of the grate-grounded type transistors in accordance with a gain setting; and
- wherein a drain of one or more gate-grounded type transistor among the at least two gate-grounded type transistors is connected to an output terminal that is connectable to an input of a circuit in a subsequent stage.

13. The variable gain circuit according to claim 12, wherein
the switch is controlled so that a total number of the gate-grounded type transistors each connected to the voltage source is always the same number.

14. The variable gain circuit according to claim 12, wherein an input resistance is varied by varying a current amount of the current source.

15. The variable gain circuit according to clam 12, wherein said current source is a variable current source.

16. The variable gain circuit according to claim 15, wherein an input resistance is constantly controlled by controlling one of i) a total number of the gate-grounded type transistors that are not connected to the ground potential, and ii) a current amount of the variable current source.

* * * * *